(12) United States Patent
Liang et al.

(10) Patent No.: US 12,342,717 B2
(45) Date of Patent: Jun. 24, 2025

(54) PEROVSKITE SOLAR CELL AND MANUFACTURING METHOD

(71) Applicant: CONTEMPORARY AMPEREX TECHNOLOGY (HONG KONG) LIMITED, Hong Kong (CN)

(72) Inventors: Weifeng Liang, Fujian (CN); Juanjuan Sun, Fujian (CN); Changsong Chen, Fujian (CN); Bao Tu, Fujian (CN); Wenming Guo, Fujian (CN); Yongsheng Guo, Fujian (CN); Guodong Chen, Fujian (CN); Bo Luan, Fujian (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

(21) Appl. No.: 18/197,731

(22) Filed: May 16, 2023

(65) Prior Publication Data
US 2023/0284520 A1    Sep. 7, 2023

Related U.S. Application Data

(63) Continuation of application No. PCT/CN2021/143789, filed on Dec. 31, 2021.

(51) Int. Cl.
*H10K 85/50*   (2023.01)
*H10K 30/50*   (2023.01)
(Continued)

(52) U.S. Cl.
CPC ............ *H10K 85/50* (2023.02); *H10K 30/81* (2023.02); *H10K 30/86* (2023.02); *H10K 30/88* (2023.02);
(Continued)

(58) Field of Classification Search
CPC ........ H10K 85/50; H10K 30/88; H10K 30/81; H10K 30/86; H10K 30/50; H10K 85/30
See application file for complete search history.

(56) References Cited

U.S. PATENT DOCUMENTS

2016/0380125 A1    12/2016  Snaith et al.
2020/0194686 A1*   6/2020   Schneider .............. H10K 30/30
(Continued)

FOREIGN PATENT DOCUMENTS

CN    106062983 A    10/2016
CN    111333654 A    6/2020
(Continued)

OTHER PUBLICATIONS

Zhang et al, Additive Engineering by 6 Aminoquinoline Monohydrochloride for High-Performance Perovskite Solar Cells, ACS Appl. Energy Mater. 2021, 4, 7083-7090. (Year: 2021).*
(Continued)

*Primary Examiner* — Andrew J Golden
(74) *Attorney, Agent, or Firm* — XSENSUS LLP

(57) ABSTRACT

The present disclosure provides a perovskite solar cell comprising at least an electrode, an electron transport layer, a hole transport layer, a perovskite layer and a passivation layer. In the perovskite solar cell, the passivation layer may contain a passivator, the passivatormay comprise an aza fused bicyclic compound and/or an organic salt formed from the aza fused bicyclic compound and an acid, each fused ring in the aza fused bicyclic compound may be independently a five-membered or six-membered saturated ring, unsaturated ring or aromatic ring, the fused ring of the aza fused bicyclic compound may contain 1-5 nitrogen atoms, and the fused ring may be an unsubstituted ring or a ring substituted with one or two substituents having 1-3 carbon atoms.

6 Claims, 1 Drawing Sheet

(51) Int. Cl.
   *H10K 30/81* (2023.01)
   *H10K 30/86* (2023.01)
   *H10K 30/88* (2023.01)
   *H10K 71/12* (2023.01)
   *H10K 71/40* (2023.01)

(52) U.S. Cl.
   CPC ............ *H10K 71/12* (2023.02); *H10K 71/40* (2023.02); *H10K 30/50* (2023.02)

(56) References Cited

U.S. PATENT DOCUMENTS

| | | |
|---|---|---|
| 2021/0028319 A1 | 1/2021 | Snaith et al. |
| 2021/0057591 A1 | 2/2021 | Snaith et al. |
| 2021/0167287 A1* | 6/2021 | Horiuchi ................ H10K 85/50 |

FOREIGN PATENT DOCUMENTS

| | | |
|---|---|---|
| CN | 113193002 A | 7/2021 |
| EP | 3084854 A1 | 10/2016 |
| KR | 20160100355 A | 8/2016 |
| WO | 2015092397 A1 | 6/2015 |

OTHER PUBLICATIONS

Wang et al, Carbon-Based Stable CsPbIBr2 Solar Cells with Efficiency of over 10% from Bifunctional Quinoline Sulfate Modification, ACS Appl. Energy Mater. 2021, 4, 5747-5755. (Year: 2021).*

Extended European Search Report issued Dec. 19, 2023 in European Patent Application No. 21963472.2.

Guodong Li, et al., "Excellent quinoline additive in perovskite toward to efficient and stable perovskite solar cells", Journal of Power Sources, Elsevier, Amsterdam, NL, vol. 481, Sep. 11, 2020, XP086357570, ISSN: 0378-7753, DOI: 10.1016/J.POWSOUR.2020.228857.

Written Opinion mailed on Sep. 16, 2022, received for PCT Application PCT/CN2021/143789, filed on Dec. 31, 2021, 5 pages including English Translation.

Office Action issued Mar. 25, 2025 in Korean Patent Application No. 10-2024-7022572 with English translation thereof.

Xinpeng Zhang, et al., "Additive Engineering by 6-Aminoquinoline Monohydrochloride for High-Performance Perovskite Solar Cells", ACS Applied Energy Materials, 2021, vol. 4, pp. 7083-7090, Jun. 30, 2021.

* cited by examiner

PEROVSKITE SOLAR CELL AND MANUFACTURING METHOD

CROSS-REFERENCE TO RELATED APPLICATION

The present application is a continuation of International Application No. PCT/CN2021/143789, filed on Dec. 31, 2021, which is incorporated herein by reference in its entirety.

TECHNICAL FIELD

The present disclosure relates to a perovskite solar cell with improved stability and a method for manufacturing the perovskite solar cell.

BACKGROUND ART

With the trend of slowing down the global warming and paying more and more attention to the construction of ecological civilization, the diversification of energy sources and the development of green energy have also attracted more and more attention. Among them, solar power generation, which converts solar energy into electric energy, has no carbon emission during energy conversion, and has a high degree of freedom of equipment installation, so it has been widely used. However, at present, the mainstream solar power generation devices are silicon-based solar cell panels based on monocrystalline silicon or polycrystalline silicon. Such silicon-based solar cell panels have problems, such as a heavy cell panel weight, a complex production process, a relatively high energy consumption and cost in the production process.

In order to solve the above problems, solar cells which can be manufactured by using a solution process are proposed. Among them, solar cells comprising a perovskite-type crystal structure as a light conversion layer have attracted much attention due to their conversion efficiencies close to that of silicon-based solar cells.

However, since the perovskite-type crystal structure is relatively fragile, maintaining the lattice morphology unchanged for a long time in the service environment being difficult has become a significant factor affecting the service life of a perovskite solar cell.

In order to improve the stability of a perovskite-type crystal, it is proposed in CN 106062983 A that when during the manufacturing of a perovskite solar cell, a passivation layer containing a passivator such as thiophene or pyridine is further formed on the precipitated perovskite layer. However, the inventors have found that there is still room for improvement in the selection of the passivator in the prior art.

In addition, in the prior art, the method for forming a passivation layer usually involves applying a solution containing a perovskite precursor to a layer bearing a perovskite layer, then applying an anti-solvent to extract a solvent from perovskite, causing the perovskite structure to precipitate, heating the perovskite layer to remove excess solvent, changing the perovskite into an active perovskite phase, applying a passivator to the surface of the perovskite, and finally annealing the perovskite layer to remove the solvent to form a passivation layer on the perovskite layer. However, there is also room for further simplification of such a method for forming passivation layer.

SUMMARY OF THE DISCLOSURE

Issue to be Solved by the Disclosure

Deep and shallow energy level defects exist during the preparation of a perovskite solar cell and the operation of a device, and these defects seriously affect the efficiency and long-term stability of the cell. It has been found through experiments that organic small molecular ammonium salts can passivate the defects on the surface of perovskite and improve the efficiency and stability of the device. However, currently existing passivators are mostly monocyclic organic small molecular amines, and the effects thereof on improving the efficiency and stability of a cell device are still not satisfactory.

The issue to be solved by the present disclosure is to provide a perovskite solar cell, comprising a passivation layer having superior effects on improving the efficiency and stability of a cell, and a method for manufacturing a perovskite solar cell containing the passivation layer.

Technical Solution to the Issue

One aspect of the present disclosure is a perovskite solar cell, comprising at least an electrode, an electron transport layer, a hole transport layer, a perovskite layer and a passivation layer.

The above-mentioned passivation layer contains a passivator, the passivator comprises an aza fused bicyclic compound and/or an organic salt formed from the aza fused bicyclic compound and an acid, each fused ring in the aza fused bicyclic compound is independently a five-membered or six-membered saturated ring, unsaturated ring or aromatic ring, the fused ring of the aza fused bicyclic compound contains 1-5 nitrogen atoms, and the above-mentioned fused ring is an unsubstituted ring or a ring substituted with one or two substituents having 1-3 carbon atoms.

In the above-mentioned perovskite solar cell, preferably, the aza fused bicyclic compound is selected from any one of pteridine, 1,5,7-triazabicyclo(4.4.0)dec-5-ene, quinazoline, quinoline, 1,5-diazabicyclo[4.3.0]-5-nonene, imidazo[1,2-a]pyrimidine, 5,6,7,8-tetrahydroindazine, 1-methyl-2,3-dihydro-1H-pyrrolizine and 2,4-dimethylquinoline.

In the above-mentioned perovskite solar cell, preferably, the acid radical ion in the organic salt is selected from one of acid radical ions containing O, S, P, N, F, I, Br, Cl, C and H.

In the above-mentioned perovskite solar cell, preferably, the acid radical ion is selected from an acid radical ion of one of acetic acid, phosphoric acid, nitric acid, chloric acid, sulfonic acid, sulfuric acid, hydrofluoric acid, hydrochloric acid, hydrobromic acid and hydroiodic acid.

In the above-mentioned perovskite solar cell, preferably, the passivation layer is a layer formed by applying an anti-solvent in which the passivator is dissolved to the perovskite layer. The anti-solvent is selected from at least one of toluene, chlorobenzene, dichlorobenzene, ethyl acetate, diethyl ether, benzene, anhydrous ethanol, isopropanol, butanol, chloroform, methyl butyrate, anisole, xylene and trimethylbenzene.

In the above-mentioned perovskite solar cell, preferably, the molar ratio of perovskite in the perovskite layer to the passivator in the passivation layer is 100-800 and may be 200-600 or 250-400.

Therefore, by using the above-mentioned passivator, a perovskite solar cell with improved cell efficiency and stability can be obtained.

Another aspect of the present disclosure is to provide a power generation device using one of the above-mentioned perovskite solar cells. Therefore, a power generation device with improved efficiency and stability can be provided.

Another aspect of the present disclosure is to provide a power consuming device using one of the above-mentioned perovskite solar cells. Therefore, a power consuming device with improved efficiency and stability can be provided.

Another aspect of the present disclosure is to provide a method for forming the passivation layer in the above-mentioned perovskite solar cell, which method is characterized by comprising the following steps:

the steps of applying a perovskite precursor solution to a layer bearing a perovskite layer, then directly applying an anti-solvent containing a passivator, and then performing annealing, wherein the passivator comprises an aza fused bicyclic compound and/or an organic salt formed from the aza fused bicyclic compound and an acid, each fused ring in the aza fused bicyclic compound is independently a five-membered or six-membered saturated ring, unsaturated ring or aromatic ring, the fused ring of the aza fused bicyclic compound contains 1-5 nitrogen atoms, and the above-mentioned fused ring is an unsubstituted ring or a ring substituted with one or two substituents having 1-3 carbon atoms.

In the above-mentioned method, preferably, the aza fused bicyclic compound is selected from any one of pteridine, 1,5,7-triazabicyclo(4.4.0)dec-5-ene, quinazoline, quinoline, 1,5-diazabicyclo[4.3.0]-5-nonene, imidazo[1,2-a]pyrimidine, 5,6,7,8-tetrahydroindazine, 1-methyl-2,3-dihydro-1H-pyrrolizine and 2,4-dimethylquinoline.

In the above-mentioned method, preferably, the acid radical ion in the organic salt is selected from one of acid radical ions containing O, S, P, N, F, I, Br, Cl, C and H.

In the above-mentioned method, preferably, the acid radical ion is selected from one of acid radical ions of acetic acid, phosphoric acid, nitric acid, chloric acid, sulfonic acid, sulfuric acid, hydrofluoric acid, hydrochloric acid, hydrobromic acid and hydroiodic acid.

In the above-mentioned method, preferably, the anti-solvent is selected from at least one of toluene, chlorobenzene, dichlorobenzene, ethyl acetate, diethyl ether, benzene, anhydrous ethanol, isopropanol, butanol, chloroform, methyl butyrate, anisole, xylene and trimethylbenzene.

In the above-mentioned method, preferably, in the anti-solvent, the concentration of the passivator is 0.1-10 mmol/mL.

In the above-mentioned method, preferably, the molar ratio of the perovskite precursor in the perovskite precursor solution to the passivator in the anti-solvent is 200-8000 and may be 800-1600 or 1000-1200.

Therefore, the passivation layer can be formed by means of a simpler and more convenient method, and the surface and grain boundary of the perovskite structure can be passivated omnidirectionally, thus providing a perovskite solar cell with better cell efficiency and stability.

Effects of the Disclosure

The perovskite solar cell according to the present disclosure can improve the efficiency and stability of a cell, and the manufacturing method according to the present disclosure can provide a perovskite solar cell with the above-mentioned advantages in a simpler and more convenient manner.

EXPLANATION OF SIGNS

1: substrate; 2: first electrode; 3: electron/hole transport layer; 4: perovskite layer; 5: passivation layer; 6: hole/electron transport layer; and 7: second electrode.

DETAILED DESCRIPTION OF EMBODIMENTS

In order to make the technical problems to be solved by the present disclosure and the technical solutions and beneficial effects of the present disclosure clearer, the present disclosure will be further illustrated in detail in conjunction with the accompanying drawings and examples. It should be understood that the specific examples described here are only used to explain, rather than limiting, the present disclosure.

1 Perovskite Solar Cell

Figure 1:
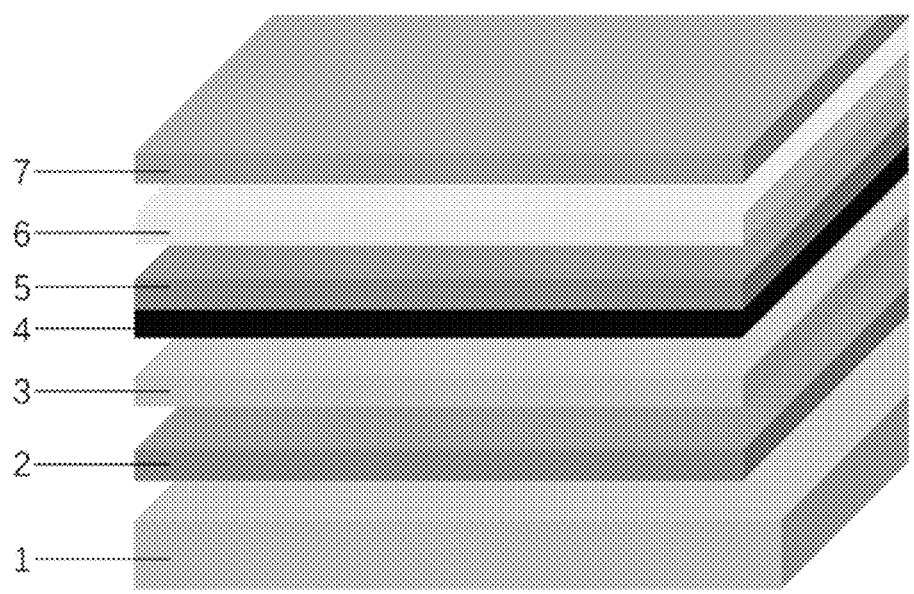
FIG. 1 is a schematic diagram of the structure of a perovskite solar cell.

Firstly, the perovskite solar cell of the present disclosure is briefly described. As shown in FIG. 1, the perovskite solar cell of the present disclosure comprises a first electrode layer 2, an electron transport layer 3, a perovskite layer 4, a passivation layer 5, a hole transport layer 6 and a second electrode layer 7 in this order. When light irradiates the perovskite layer, the perovskite structure absorbs the energy of photons to generate free electrons and holes (electrons and holes are sometimes collectively referred to as "carriers" below), and the generated free electrons and holes are respectively conducted to the first electrode and the second electrode via the electron transport layer and the hole transport layer to generate a voltage between the first electrode and the second electrode, thus realizing energy conversion between light and electricity. It needs to be noted that FIG. 1 only schematically shows one embodiment of forming the passivation layer 5 on one side of the perovskite layer 4; however, the present disclosure is not limited to this structure, for example, the passivation layer 5 may also be formed on either side or both sides of the perovskite layer 4.

1.1 Perovskite Layer 4

Figure 2:
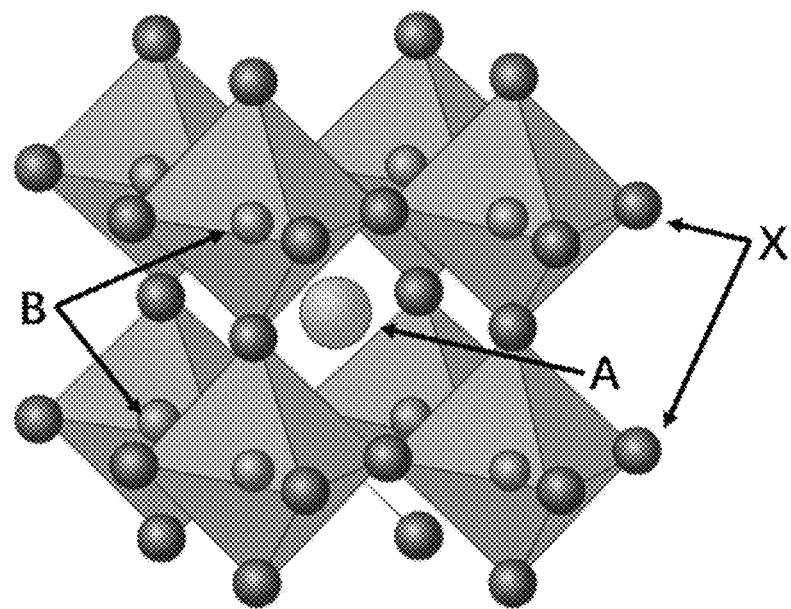
FIG. 2 is a structural schematic diagram of a perovskite structure.

The perovskite layer contains a crystal with a perovskite structure, and has a crystalline structure shown in FIG. 2. The perovskite structure conventionally used in solar cells can be expressed as an $ABX_3$ structure, where A is a positively charged ion with a certain size, such as ions of alkali metals such as cesium, ions of small molecular nitrogen-containing organic compounds such as methylamine ($CH_3NH_2$) and formamidine ($HNCHNH_2$), etc.; B is an ion of a transition metal element, such as an ion of Pb or Sn; and X is a halogen ion, such as an ion of Br or I.

It needs to be noted that in the common $ABX_3$ structure, a B-X octahedron composed of B and X is filled in with A, thereby forming a lattice structure. Therefore, there is a certain size requirement for the cation in the A position, which size requirement is usually called "tolerance factor", and the tolerance factor needs to be between 0.8 and 1.2. Whether the tolerance factor is too large or too small, the stability of the lattice structure will be significantly affected, or the expected structure will not be formed.

With regard to the instability of the perovskite structure, which is specifically related to the fact that deep and shallow energy level defects exist during the preparation of a perovskite solar cell and the operation of a device, these defects seriously affect the efficiency and long-term stability of the cell. In addition, the instability of the calcium structure also comes from easy hydrolysis when it meets water.

1.2 Passivation Layer 5

The passivation layer is a layer arranged between the perovskite layer and the electron transport layer and/or the hole transport layer in order to improve the stability of the perovskite structure and the life of the solar cell equipment, and the layer contains a passivator.

The inventors have found that compared with the existing passivators, the use of the following passivator results in a better effect on improving the cell efficiency and prolonging the cell life. The passivator of the present disclosure comprises an aza fused bicyclic compound and/or an organic salt formed from the aza fused bicyclic compound and an acid, each fused ring in the aza fused bicyclic compound is independently a five-membered or six-membered saturated ring, unsaturated ring or aromatic ring, the fused ring of the aza fused bicyclic compound contains 1-5 nitrogen atoms, and the above-mentioned fused ring is an unsubstituted ring or a ring substituted with one or two substituents having 1-3 carbon atoms.

The substituent on the above-mentioned fused ring may be hydrocarbyl, alcohol group, ether group, ester group, aldehyde group, ketone group, carboxyl, carbonyl, amide group, imide group, or a combination thereof, and can be specifically exemplified by methyl, ethyl, n-propyl and isopropyl; methanol group, ethanol group, n-propanol group, and isopropanol group; methyl ether group, ethyl ether group and propyl ether group; methyl ester group, ethyl ester group, and propyl ester group; formaldehyde group, acetaldehyde group, and propionaldehyde group; methanone group, ethanone group, and acetone group; formic acid group, acetic acid group and propionic acid group; and formamide group, acetamide group, and propionamide group.

Where formamidine as an organic component is, for example, used in the A position, high temperature caused by direct sunlight and non-radiative recombination caused by defects may both cause the device to be heated, which will lead to the volatilization of formamidine, resulting in defects in the A position. Most of the existing interface passivators form a two-dimensional structure to prevent the cation in the A position from volatilization; however, the A position may shift to form defects at many sites. In addition, with the increase of defects, the internal resistance of the device increases due to the capture of carriers such as free electrons or holes, the difficulty of carrier extraction increases, and the short-circuit current decreases. In addition, the decomposition of perovskite may lead to a decrease in the stability of the device. Therefore, passivation with an existing passivator is not effective in improving the long-term stability of the device.

However, in the present disclosure, the above-mentioned passivator containing an aza fused bicyclic compound and/or an organic salt thereof formed with an acid is used to passivate defects at the grain boundary and on the surface of perovskite.

The nitrogen atom in the ring in the above-mentioned aza fused bicyclic compound and/or the organic salt thereof formed with the acid in the passivator of the present disclosure has a stronger proton binding ability and forms a strong chemical bond with the A position, whereby the cation in the A position can be prevented from decomposition or volatilization caused by various reasons, and generation of harmful hydrogen vacancies does not easily occur during use, thus improving the passivation stability and the device efficiency.

The aza fused bicyclic compound can be specifically exemplified by the substances used in the examples; however, the present disclosure is not limited to these compounds.

The principle thereof is uncertain, but it can be speculated that compared with the prior art, the number of rings in the compound used in the present disclosure is increased, which improves the hydrophobic property of the material, and it can be introduced as hydrophobic functional groups and can significantly improve the water stability of perovskite. In addition, the nitrogen in the nitrogen heterocyclic ring has a relatively strong proton binding energy with the A position in perovskite, which can inhibit the loss of the ion in the A position, thus enhancing the passivation effect.

The acid radical ion in the organic salt formed with the above-mentioned compound is selected from one of acid radical ions containing O, S, P, N, F, I, Br, Cl, C and H.

Specifically, the acid radical ion can be, by way of example, selected from an acid radical ion of one of acetic acid, phosphoric acid, nitric acid, chloric acid, sulfonic acid, sulfuric acid, hydrofluoric acid, hydrochloric acid, hydrobromic acid and hydroiodic acid.

The acid radical ion is preferably selected from one of hydrofluoric acid, hydrochloric acid, hydrobromic acid and hydroiodic acid, because when a halogen is selected as the acid radical ion, it can make up the halogen vacancy on the perovskite surface. From the point of view of being able to make up for the defect in the X position and being able to form hydrogen bond with the cation in the A position to stabilize the cation in the A position, the acid radical ion is preferably derived from hydrofluoric acid.

In addition, the acid radical ion is preferably derived from one of acids containing oxygen, sulfur, phosphorus, etc., such as from one of carboxylic acid, sulfonic acid, sulfuric acid and phosphoric acid. This is because the acid radical ions derived from these acids can form hydrogen bonds with the ion in the A position and can at the same time anchor the ion in the B position, thus achieving the effects of stabilizing the ions in the A and B positions, further stabilizing the perovskite structure and improving the long-term stability of the cell device.

In the above-mentioned perovskite solar cell, preferably, the molar ratio of perovskite in the perovskite layer to the passivator in the passivation layer (the molar amount of the perovskite/the molar amount of the passivator) is 100-800 and may be 200-600 or 300-400. Compared with perovskite, when the amount of the passivator is too small, neither can the defects in the perovskite structure be fully passivated, nor ideal hydrophobicity can be imparted. However, when the amount of the passivator is too much, the passivation effect reaches saturation while the cost-effectiveness ratio is decreased; in addition, it may cause adverse effects such as blocked carrier transmission, increased internal resistance and even cell failure.

1.3 Electron Transport Layer 3 and Hole Transport Layer 6

The electron transport layer and the hole transport layer are layers formed on the two sides of the perovskite layer and the passivation layer, and are respectively used to transport free electrons and holes generated on the perovskite layer. By separating the electrons from the holes and further transporting them to the first electrode and the second electrode, recombination of holes and electrons can be avoided, thus reducing the lost conversion efficiency. It needs to be noted that FIG. 1 shows only one case that the present disclosure can take, and the positions of the electron transport layer and the hole transport layer of the present disclosure can also be interchanged.

The transmittance of at least one of the electron transport layer and the hole transport layer in the visible light band is 50% or more, 60% or more, 70% or more, 80% or more, 90% or more or 95% or more.

Those skilled in the art can appropriately select the electron transport layer within the range favorable to the conversion efficiency, and this layer is composed of a conventional electron transport material. For example, tin oxide, titanium oxide, PCBM, C60 can be used, and tin oxide is preferred. In addition, with regard to the preparation method for this layer, the preparation can be carried out by appropriately combining conventional methods such as coating, evaporation and annealing.

Those skilled in the art can appropriately select the hole transport layer within the range favorable to the conversion efficiency, and this layer is composed of a conventional hole transport material. For example, PTAA, spiro, PEDOT:PSS can be used, and spiro is preferred. In addition, with regard to the preparation method for this layer, the preparation can be carried out by appropriately combining conventional methods such as coating, evaporation and annealing.

1.4 First Electrode 2 and Second Electrode 7

The first electrode is laminated on the electron transport layer in the direction opposite to the perovskite layer, and is an electrode for guiding electrons conducted by the electron transport layer to the outside for use. The second electrode is laminated on the hole transport layer in the direction opposite to the perovskite layer, and is an electrode for guiding holes conducted by the hole transport layer to the outside for use. It needs to be noted that FIG. 1 shows only one case that the present disclosure can take, and the positions of the first electrode and the second electrode of the present disclosure can also be interchanged.

As the first electrode and the second electrode, when they are non-transparent electrodes, they can be composed of conventional materials for electrodes, and those skilled in the art can appropriately select them within the range favorable to conversion efficiency. For example, gold, silver, copper, aluminum, etc. can be used, and gold is preferred. In addition, with regard to the preparation method for this layer, the preparation can be carried out by appropriately combining conventional methods such as coating, evaporation and annealing.

At least one of the first electrode and the second electrode is a transparent electrode, and the transmittance of the transparent electrode in the visible light band is 50% or more, 60% or more, 70% or more, 80% or more, 90% or more or 95% or more. The transparent electrode can be composed of conventional materials for transparent electrodes, and those skilled in the art can appropriately select them within the range favorable to conversion efficiency. For example, conductive oxides, metal mesh, ultra-thin metal layers, nano-metal wires, carbon-based transparent materials, polymers, etc. can be used. From the aspect of high light transmittance, conductive oxides are preferred. In addition, with regard to the preparation method for this electrode, the preparation can be carried out by the appropriate combination of conventional methods such as coating, evaporation and annealing.

1.5 Substrate 1

If necessary, a substrate may be further provided outside the first electrode and/or the second electrode. The substrate is used to support the whole perovskite solar cell, for the convenience of operation, assembly, etc.

The substrate can be an organic or inorganic flexible material such as polyimide (PI), polybutylene terephthalate (PET), polyamide (PA), polycarbonate (PC), or ultra-thin glass, or may also be a rigid material such as a glass plate or a metal plate.

Where a substrate is provided on the outside of both the first electrode and the second electrode, the transmittance of at least one of the substrates in the visible light band is 50% or more, 60% or more, 70% or more, 80% or more, 90% or more or 95% or more. In addition, the transparent substrate is arranged on one side of the transparent electrode.

In addition, when the first electrode and/or the second electrode have sufficient capacity to support the perovskite solar cell, the substrate may also be omitted.

2 Method for Manufacturing Perovskite Solar Cell

The method for manufacturing the perovskite solar cell comprises:

applying a perovskite precursor solution to a layer bearing a perovskite layer (step 1), directly applying an anti-solvent containing the above-mentioned passivator to the perovskite precursor solution layer (step 2), and performing annealing (step 3). In the method, for the application in steps 1 and 2, conventional methods such as spin coating, blade coating, roller coating and spray coating can be used; however, from the point of view of being able to better control the thickness, spin coating is preferred.

Such a manufacturing method can simplify the step of preparing the passivation layer and avoid the influence of multiple annealing on the perovskite structure. In addition, passivation can be realized during the formation of the perovskite structure.

Specifically, compared with the prior art, the method of the present disclosure reduces the number of times of the annealing treatment, avoids multiple annealing of perovskite, saves time and cost, and improves the preparation efficiency.

In addition, in the method of the present disclosure, when the perovskite phase is unstable, a passivator is added, and the passivator can better bond with the perovskite at the grain boundary and on the surface, so that the perovskite phase is more stable.

As the passivator not only exists on the surface of the perovskite layer, but can also penetrate deep into grain boundary, it can passivate both the grain boundary and surface and realize omnidirectional passivation. This can effectively prevent the recombination of electrons and holes at the grain boundary and on the surface. In addition, even if the grain boundary is relatively small, the use of the method of the present disclosure can also make the passivator with larger molecular volume enter the grain boundary deeply. In addition, since the passivator only exists in the anti-solvent, the passivator does not affect the formation of the perovskite structure. This is difficult to achieve by using the existing technology.

2.1 Perovskite Precursor Solution

The perovskite precursor solution contains a perovskite precursor and a solvent. Specifically, the perovskite precursor is a substance containing A ion, B ion and X ion. The perovskite precursor solution can be exemplified by, for example, a mixture of $BX_2$ and AX in a solvent. In the mixture, A is as mentioned above and can be selected from alkali metals such as cesium or small molecular nitrogen-containing organic compounds such as methylamine and formamidine, B is Sn or Pb, and X is a halogen.

The solvent in the perovskite precursor solution is any solvent as long as it can dissolve $BX_2$ and AX, is mutually soluble with the anti-solvent, and can be removed by heating, and the solvent can be appropriately selected from solvents conventionally used at present. Those skilled in the art can choose any suitable combination from the prior art to prepare a perovskite precursor solution.

The molar ratio of $BX_2$ to AX ($BX_2$/AX) is 1 or more, 1.01 or more, 1.02 or more, 1.03 or more, 1.04 or more, or 1.05 or more from the point of view of being able to fully form a perovskite layer structure, and is 1.5 or less, 1.4 or less, 1.3 or less, 1.2 or less or 1.1 or less from the point of view of cost saving.

In the perovskite precursor solution, the concentration of the perovskite precursor is used to adjust the thickness of the formed perovskite layer, and the ideal concentration thereof is 0.2-5 mmol/mL, 0.3-4 mmol/mL, 0.4-3 mmol/mL, or 0.5-2 mmol/mL, calculated by $BX_2$ concentration. This concentration is conducive to the formation of a satisfactory perovskite structure.

It needs to be noted that the tolerance factor of the A ion is necessarily 0.8-1.2. If the tolerance factor exceeds 1.2 due to the excessive ion volume, lattice deformation occurs, or it is difficult to fill in the B-X octahedral structure, which in turn leads to the concern that the perovskite structure cannot be formed Even if this structure can be formed, the perovskite may be blocked during crystallization, resulting in the reduction of the crystalline quality of perovskite, the formation of too many grain boundaries, the generation of deep energy level defects, and the capture of carriers, leading to concerns about the reduction of the photoelectric conversion efficiency and the stability.

When it contains more than two kinds of A ions, it is preferred that the tolerance factors thereof are both 0.8-1.2. This is because if there is a larger molecule, it will damage the crystal structure as above. Even if used as an additive, it will also lead to a poor crystallization quality due to its larger structure, which is difficult to achieve a good stability.

2.2 Solution Containing Passivator

The solution containing a passivator in this method comprises an anti-solvent and a passivator.

The anti-solvent is a solvent used for converting a perovskite precursor into a perovskite structure. The anti-solvent in the present disclosure is a solvent with a low solubility for the perovskite precursor, and is selected from at least one of toluene, chlorobenzene, dichlorobenzene, ethyl acetate, diethyl ether, benzene, anhydrous ethanol, isopropanol, butanol, chloroform, methyl butyrate, anisole, xylene and trimethylbenzene. The anti-solvent is preferably a mixed solvent formed by adding at least one second anti-solvent selected from diethyl ether, benzene, anhydrous ethanol, isopropanol, butanol, chloroform, methyl butyrate, anisole, xylene and trimethylbenzene to at least one first anti-solvent selected from toluene, chlorobenzene, dichlorobenzene and ethyl acetate.

By adjusting the ratio of the first anti-solvent to the second anti-solvent, the solubility of the precursor in the anti-solvent can be adjusted, such that the precipitation rate and crystal size of the perovskite structure can be controlled when the anti-solvent comes into contact with the precursor in the precursor solution.

In the anti-solvent, the ratio (by volume) of the first anti-solvent to the second anti-solvent is 100:0 to 100:50, preferably 100:0 to 100:10. The precipitation rate and crystal size of the perovskite structure can be favorably controlled when the anti-solvent is prepared by mixing at such a ratio.

The anti-solvent of the present disclosure contains the passivator of the present disclosure, and the description will not be repeated here. It needs to be noted that even the passivator in the prior art can be used in the method for forming the passivation layer of the present disclosure.

In the anti-solvent, the concentration of the passivator is 0.1-10 mmol/mL, and may be 0.5-8 mmol/mL, 1-5 mmol/mL and 2-3 mmol/mL. In the above-mentioned range, the content of the passivator in the passivation layer can be easily controlled without affecting the precipitation of the perovskite structure.

The molar ratio (R) of the perovskite precursor in the perovskite precursor solution to the passivator in the anti-solvent is 200-8000 and may be 800-1600 or 1000-1200. Compared with the perovskite precursor, when the amount of the passivator is too small, neither can the defects in the perovskite structure be fully passivated, nor ideal hydrophobicity can be imparted. However, when the amount of the passivator is too much, the passivation effect reaches saturation while the cost-effectiveness ratio is decreased; in addition, it may cause adverse effects such as blocked carrier transmission, increased internal resistance and even cell failure.

2.3 Annealing

In the present disclosure, after the perovskite precursor solution and the anti-solvent have been applied, an annealing treatment is carried out. During the annealing treatment, the solvent and anti-solvent in the precursor solution volatilize, and the precursor precipitates to form a perovskite structure, thereby forming a perovskite layer and a passivation layer. At the same time, the passivator passivates the grain boundary and surface of the perovskite structure.

The annealing treatment conditions can be appropriately set according to the type of the solvent used and the parameters of the annealing equipment, and are not particularly limited. However, from the point of view of being able to obtain a perovskite structure with good order, annealing at 80-200° C. for 10 minutes to 2 hours can be carried out. For example, the annealing conditions in the examples below can be used.

3 Power Generation Device

The power generation device of the present disclosure is a power generation device comprising the above-mentioned perovskite solar cells, and the number of the perovskite solar cells may be one or more. The power generation device also has a control system and a transport system. By means of the control system and the transport system, the power generation device of the present disclosure adjusts the electric energy generated from the above-mentioned solar cell to be able to match the electric energy of the power consuming equipment. It needs to be noted that the term "comprise" here refers to the case where the power generation device is electrically connected to the solar cell.

4 Power Consuming Device

The power consuming device of the present disclosure is a power consuming device comprising the above-mentioned perovskite solar cells, and the number of the perovskite solar cells may be one or more. The power consuming device further has a system that utilizes the electric energy generated from the above-mentioned perovskite solar cell. The system that utilizes electric energy can be exemplified by, for example, a system that converts electric energy into kinetic energy, internal energy, light energy, chemical energy, etc. It needs to be noted that the term "comprise" here refers to the case where the power consuming device is electrically connected to the solar cell.

EXAMPLES

The embodiments of the technical solution of the present application will be described in detail below. The following embodiments are only intended to more clearly illustrate the technical solutions of the present application, so they only serve as examples and should not be used to limit the scope of protection of the present application.

Unless otherwise defined, all technical and scientific terms used herein have the same meanings as those commonly understood by those skilled in the art to which the present application belongs. The terms used herein are merely for the purpose of describing specific embodiments, but are not intended to limit the present application. The terms "comprise" and "have" and any variations thereof in the description and claims of the present application and in the Brief Description of the Drawings above are intended to cover non-exclusive inclusion.

In the description of the embodiments of the present application, the technical terms "first", "second", etc. are merely used for distinguishing different objects, and are not to be construed as indicating or implying relative importance or implicitly indicating the number, particular order or primary-secondary relationship of the technical features modified thereby. In the description of the embodiments of the present application, the phrase "a plurality of" means two or more, unless otherwise explicitly and specifically defined.

The phrase "embodiment" mentioned herein means that the specific features, structures, or characteristics described in conjunction with the embodiment may be encompassed in at least one embodiment of the present application. The phrase at various locations in the description does not necessarily refer to the same embodiment, or an independent or alternative embodiment exclusive of another embodiment. Those skilled in the art understand explicitly or implicitly that the embodiment described herein may be combined with another embodiment.

In the description of the embodiments of the present application, the term "and/or" is merely intended to describe the associated relationship of associated objects, representing that three relationships can exist, for example, A and/or B can include: three cases, i.e. A alone, both A and B, and B alone. In addition, the character "/" herein generally indicates an "or" relationship between the associated objects.

In the description of the embodiments of the present application, the orientation or positional relationship indicated by the technical terms "inside" and "outside" are based on the orientation or positional relationship shown in the accompanying drawings, only for the convenience of describing the examples of the present application and simplifying the description, instead of indicating or implying that the indicated device or element necessarily has a specific orientation and is constructed and operated in a specific orientation, and therefore, the orientation or positional relationship cannot be understood as a limitation to the embodiments of the present application.

The embodiments of the present application only show perovskite solar cells with conventional structures; however, the present disclosure can also be applied to perovskite solar cells with inverted structures.

Manufacturing of Perovskite Solar Cell

Example 1

[Preparation of Electron Transport Layer]

A 15% tin oxide solution was mixed with deionized water at a ratio of 1:3 and stirred at room temperature for 1 h, and 70 µL was taken, spun-coated on the surface of conductive glass and heated at 150° C. for 15 min.

[Preparation of Perovskite Layer and Passivation Layer]

Iodoformamidine and chloromethylamine as AX and lead iodide as $BX_2$ were added (at $BX_2/AX=1.05$) to a mixed solution of DMF and DMSO (DMF:DMSO=4:1) to prepare a perovskite solution, which was magnetically stirred at room temperature for 1 h and filtered for later use. The final concentration of the perovskite precursor in the solution was 1.5 mmol/mL on a lead iodide basis. Passivation materials in the following Tables 1 and 2 were dissolved in an anti-solvent. The conductive glass spun-coated with the electron transport layer was irradiated by UV for 15 minutes, 60 µL of the perovskite solution was dripped on the glass, 600 µL of an anti-solvent for dissolving the passivation material was added, and annealing was then carried out at 150° C. for 1 h to thereby form a perovskite layer and a passivation layer at the same time, finally forming a perovskite layer with a thickness of 500 nm and a passivation layer with a thickness of 2 nm. The ratio (molar ratio) of the perovskite phase to the passivator was 300.

[Preparation of Hole Transport Layer]

Li-TFSI, tBP and FK209 were added to spiro, and the mixture was stirred for 1 h and filtered for later use. 60 µL hof spiro was dripped on the conductive glass on which the perovskite layer and the passivation layer had been formed, and spin coating was carried out to form a hole transport layer.

[Preparation of Back Electrode]

On the above-mentioned hole transport layer formed by spin coating, silver with a thickness of 80 nm evaporated in vacuum evaporation equipment was formed by a conventional method to obtain a complete perovskite solar cell.

Examples 2-16

Perovskite solar cells were fabricated in the same manner as in Example 1 except that the formation conditions for the perovskite layer and the passivation layer were changed to those shown in Tables 1 and 2.

Comparative Examples 1-3

Perovskite solar cells were fabricated in the same manner as in Example 1 except that the passivators shown in Tables 1 and 2 were added to the perovskite precursor solution and no passivator was added to the anti-solvent.

Comparative Example 4

A perovskite solar cell was fabricated in the same manner as in Example 1 except that no passivator was added.

TABLE 1

| Compound sign | Name | Structural formula |
| --- | --- | --- |
| (Example) (1)-1 | Pteridine | |
| (1)-2 | 1,5,7-Triazabicyclo(4.4.0)dec-5-ene | |
| (1)-3 | Quinazoline | |
| (1)-4 | Quinoline | |
| (1)-5 | 1,5-Diazabicyclo[4.3.0]-5-nonene | |
| (1)-6 | Imidazo[1,2-a]pyrimidine | |
| (1)-7 | 5,6,7,8-Tetrahydroindazine | |
| (1)-8 | 1-Methyl-2,3-dihydro-1H-pyrrolizine | |
| (1)-9 | 2,4-Dimethylquinoline | |
| (Comparative Example) (2)-1 | p-Fluorophenethylamine | |
| (2)-2 | Piperazine | |
| (2)-3 | Pyrazine | |
| (2)-4 | p-Methoxyphenethylamine | |

TABLE 2

| | Passivator | | Concentration | |
|---|---|---|---|---|
| | Compound | Acid radical | mmol/mL | Anti-solvent |
| Example 1 | (1)-1 | HI | 1 | Chlorobenzene |
| Example 2 | (1)-2 | HI | 1 | Chlorobenzene |
| Example 3 | (1)-3 | HI | 1 | Chlorobenzene |
| Example 4 | (1)-4 | HI | 1 | Chlorobenzene |
| Example 5 | (1)-5 | HI | 1 | Chlorobenzene |
| Example 6 | (1)-6 | HI | 1 | Chlorobenzene |
| Example 7 | (1)-1 | Not used | 1 | Chlorobenzene |
| Example 8 | (1)-1 | HF | 1 | Chlorobenzene |
| Example 9 | (1)-1 | $H_3PO_4$ | 1 | Chlorobenzene |
| Example 10 | (1)-1 | Methanedisulfonic acid | 1 | Chlorobenzene |
| Example 11 | (1)-1 | Acrylic acid | 1 | Chlorobenzene |
| Example 12 | (1)-1 | $CH_3COOH$ | 1 | Chlorobenzene |
| Example 13 | (1)-1 | HI | 1 | Diethyl ether |
| Example 14 | (1)-1 | HI | 1 | Chlorobenzene/chloroform (100:5) |
| Example 15 | (1)-1 | HI | 0.5 | Chlorobenzene/anhydrous ethanol (100:5) |
| Example 16 | (1)-1 | HI | 2 | Chlorobenzene/xylene (100:5) |
| Comparative Example 1 | (2)-1 | HI | 1 | Chlorobenzene |
| Comparative Example 2 | (2)-2 | HI | 1 | Chlorobenzene |
| Comparative Example 3 | (2)-3 | HI | 1 | Chlorobenzene |
| Comparative Example 4 | (2)-4 | HI | 1 | Chlorobenzene |
| Comparative Example 5 | Not used | Not used | | |

Cell Characteristic Test (I-V Test)

20 solar cells of each of the examples and comparative examples obtained in the above manner were subjected to an I-V test at one sun intensity at 25° C. by using a sunlight simulator from Guangyan Gongsi, and the average values of the test results of the solar cells of the examples and comparative examples were as shown in Table 3 below.

TABLE 3

| | I-V test results | | | |
|---|---|---|---|---|
| | Open-circuit voltage Voc (V) | Short-circuit current Isc (A) | Filling factor FF | Conversion efficiency PCE (%) |
| Example 1 | 1.15 | 24.25 | 0.79 | 22.03 |
| Example 2 | 1.17 | 24.56 | 0.78 | 22.41 |
| Example 3 | 1.13 | 24.25 | 0.77 | 21.1 |
| Example 4 | 1.12 | 24.36 | 0.79 | 21.55 |
| Example 5 | 1.15 | 24.28 | 0.8 | 22.34 |
| Example 6 | 1.16 | 24.25 | 0.77 | 21.66 |
| Example 7 | 1.1 | 24.35 | 0.75 | 20.09 |
| Example 8 | 1.15 | 24.35 | 0.78 | 21.84 |
| Example 9 | 1.16 | 24.33 | 0.78 | 22.01 |
| Example 10 | 1.17 | 24.88 | 0.79 | 23 |
| Example 11 | 1.17 | 24.89 | 0.78 | 22.71 |
| Example 12 | 1.18 | 24.79 | 0.79 | 23.11 |
| Example 13 | 1.14 | 24.35 | 0.8 | 22.21 |
| Example 14 | 1.15 | 24.3 | 0.79 | 22.08 |
| Example 15 | 1.13 | 24.25 | 0.8 | 21.92 |
| Example 16 | 1.15 | 23.39 | 0.78 | 20.98 |
| Comparative Example 1 | 1.13 | 24.25 | 0.8 | 21.92 |
| Comparative Example 2 | 1.14 | 23.39 | 0.78 | 20.8 |
| Comparative Example 3 | 1.12 | 22.15 | 0.72 | 17.86 |
| Comparative Example 4 | 1.14 | 23.98 | 0.78 | 21.32 |
| Comparative Example 5 | 1.09 | 23.25 | 0.81 | 20.53 |

Stability Test 20 solar cells of each of the examples and comparative examples obtained in the above manner were stored in a glove box with a controllable humidity, aged for 30 days at a constant temperature of 25 degrees Celsius and a constant humidity of 600 RH, and thus subjected to a stability test, and the average values, efficiency retention rates, number of damaged cells, and damage rates in the I-V test results of the cells in the examples, comparative examples and reference examples, which were undamaged after the stability test, were shown in Table 4.

TABLE 4

| | Stability test results | | | | |
|---|---|---|---|---|---|
| | Average conversion efficiency before aging (%) (n = 20) | Average conversion efficiency after aging (%) (n = 20-Number of damaged cells) | Efficiency maintenance rate | Number of damaged cells | Cell damage rate |
| Example 1 | 22.03 | 21.98 | 99.80% | 2 | 10% |
| Example 2 | 22.41 | 22.5 | 100.40% | 1 | 5% |
| Example 3 | 21.1 | 21.12 | 100.10% | 2 | 10% |
| Example 4 | 21.55 | 21.5 | 99.80% | 2 | 10% |
| Example 5 | 22.34 | 22.42 | 100.40% | 3 | 15% |
| Example 6 | 21.66 | 22.01 | 101.60% | 1 | 5% |
| Example 7 | 20.09 | 20.55 | 102.30% | 7 | 35% |
| Example 8 | 21.84 | 21.96 | 100.50% | 3 | 15% |
| Example 9 | 22.01 | 21.98 | 99.80% | 3 | 15% |
| Example 10 | 23 | 23.01 | 100.10% | 1 | 5% |
| Example 11 | 22.71 | 22.82 | 100.50% | 1 | 5% |
| Example 12 | 23.11 | 23.05 | 99.70% | 1 | 5% |
| Example 13 | 22.21 | 22.19 | 99.90% | 2 | 10% |
| Example 14 | 22.08 | 21.89 | 99.20% | 3 | 15% |
| Example 15 | 21.92 | 22.05 | 100.60% | 3 | 15% |
| Example 16 | 20.98 | 20.77 | 99.00% | 5 | 25% |
| Comparative Example 1 | 21.92 | 20.88 | 95.20% | 4 | 20% |
| Comparative Example 2 | 20.8 | 19.19 | 92.30% | 5 | 25% |
| Comparative Example 3 | 17.86 | 15.23 | 85.30% | 8 | 40% |
| Comparative Example 4 | 21.32 | 20.58 | 96.50% | 5 | 25% |
| Comparative Example 5 | 20.53 | 12.25 | 59.70% | 8 | 40% |

As could be seen from the results in Tables 3 and 4 above, compared with the perovskite solar cell in which the passivator of the present disclosure was not used, the perovskite solar cell in which the passivator of the present disclosure was used had more obvious effects on improving the efficiency and stability of the device, and after the cell that did not be passivated was placed for a period of time, the efficiency of the cell decayed obviously; and with the same cation, the use of the organic acids containing the elements such as O, S, P and N as acid radical ions resulted in better passivation effects. In addition, after the perovskite solar cell in which the passivator of the present disclosure was used was placed for a period of time, the cell damage rate was obviously inhibited.

In addition, it was also found that compared with the case where the method of the present disclosure was not used, the perovskite in the perovskite solar cell obtained by using the method for manufacturing the passivation layer and perovskite layer of the present disclosure avoided secondary heating annealing and the stability of the device was better; in addition, the addition of the passivation material in the case of a wet film to control crystallization can make the passivation material better fill in at the grain boundary and on the surface, so that the perovskite was better protected and the stability of the perovskite was increased.

AVAILABILITY IN INDUSTRY

The present disclosure can provide a perovskite solar cell with high energy conversion efficiency and excellent stability, and a method for manufacturing the solar cell. This is of great significance for coping with climate change and ecological civilization building.

The invention claimed is:

1. A perovskite solar cell, characterized by
comprising at least an electrode, an electron transport layer, a hole transport layer, a perovskite layer, a passivation layer, and an optional substrate layer, wherein the passivation layer contains a passivator, the passivator comprises an organic salt formed from an aza fused bicyclic compound and an acid, each fused ring in the aza fused bicyclic compound is independently a five-membered or six-membered saturated ring, unsaturated ring or aromatic ring, the fused ring of the aza fused bicyclic compound contains 1-5 nitrogen atoms, and the fused ring is an unsubstituted ring or a ring substituted with one or two substituents having 1-3 carbon atoms, wherein the passivation layer is a layer formed by applying an anti-solvent in which the passivator is dissolved to the perovskite layer, and a concentration of the passivator in the anti-solvent is in a range of 0.5-3 mmol/mL, and the acid radical ion is selected from an acid radical ion of one of acetic acid, phosphoric acid, sulfonic acid, hydrofluoric acid, hydrochloric acid, hydrobromic acid or hydroiodic acid.

2. The perovskite solar cell of claim 1, characterized in that the aza fused bicyclic compound is selected from any one of pteridine, 1,5,7-triazabicyclo(4.4.0) dec-5-ene, quinazoline, quinoline, 1,5-diazabicyclo[4.3.0]-5-nonene, imidazo[1,2-a]pyrimidine, 5,6,7,8-tetrahydroindazine, 1-methyl-2,3-dihydro-1H-pyrrolizine or 2,4-dimethylquinoline.

3. The perovskite solar cell of claim 1, characterized in that the anti-solvent is selected from at least one of toluene, chlorobenzene, dichlorobenzene, ethyl acetate, diethyl ether, benzene, anhydrous ethanol, isopropanol, butanol, chloroform, methyl butyrate, anisole, xylene or trimethylbenzene.

4. The perovskite solar cell of claim 1, characterized in that a molar ratio of perovskite in the perovskite layer to the passivator in the passivation layer is 100-800.

5. A power generation device, characterized by comprising the perovskite solar cell of claim 1.

6. A power consuming device, characterized by comprising the perovskite solar cell of claim 1.

* * * * *